United States Patent

Vaughn et al.

Patent Number: 5,233,665
Date of Patent: Aug. 3, 1993

[54] PHONETIC EQUALIZER SYSTEM

[75] Inventors: Gary L. Vaughn, 8901 7th St. NW., Albuquerque, N. Mex. 87114; James L. Harrison, Socorro, N. Mex.

[73] Assignee: Gary L. Vaughn, Albuquerque, N. Mex.

[21] Appl. No.: 808,685

[22] Filed: Dec. 17, 1991

[51] Int. Cl.$^5$ .............................................. H03G 5/00
[52] U.S. Cl. ..................................... 381/97; 381/98; 381/17; 381/68.2; 381/68.4
[58] Field of Search .................... 381/17, 98, 61, 103, 381/63, 97, 68.2, 68.4

[56] References Cited

U.S. PATENT DOCUMENTS

| | | |
|---|---|---|
| 4,185,168 | 1/1980 | Graupe et al. |
| 4,396,806 | 8/1983 | Anderson |
| 4,400,590 | 8/1983 | Michelson |
| 4,425,481 | 1/1984 | Mansgold et al. |
| 4,566,119 | 1/1986 | Peters ................................ 381/103 |
| 4,627,094 | 12/1986 | Scholz ................................ 381/61 |
| 4,706,287 | 11/1987 | Blackmer et al. ...................... 381/63 |
| 4,731,850 | 3/1988 | Levitt et al. ......................... 381/68.2 |
| 4,845,758 | 7/1989 | Op de Beek et al. .................. 381/98 |
| 4,852,175 | 7/1989 | Kates .................................. 381/68.4 |
| 4,879,749 | 11/1989 | Levitt et al. ......................... 381/68.4 |
| 4,956,867 | 9/1990 | Zurek et al. .......................... 381/94.1 |
| 5,027,410 | 6/1991 | Williamson et al. ................... 381/68.4 |

FOREIGN PATENT DOCUMENTS

| | | | |
|---|---|---|---|
| 1228160 | 8/1960 | France | 381/17 |
| WO90/13942 | 11/1990 | PCT Int'l Appl. | |
| 942459 | 11/1963 | United Kingdom | 381/17 |

OTHER PUBLICATIONS

Chamberlin, Musical Applications of Microprocessors, 1980, pp. 447–451.
Tattersal (1981) *Transactions On Circuits And Systems*, vol. CAS-28, No. 9. pp. 925–927.

Primary Examiner—Forester W. Isen
Attorney, Agent, or Firm—Lahive & Cockfield

[57] ABSTRACT

An audio equalizer system includes a filter having a passband extending substantially continuously across the audio spectrum, with the filter having an input terminal and an output terminal. An input network is adapted to apply an input audio signal to the input terminal of the filter, and an output network is adapted to provide an output audio signal representative of the signal at the output terminal of the filter. The group delay of the filter varies continuously with frequency across the audio spectrum, with that group delay being relatively high but less than approximately 10 milliseconds at frequencies less than approximately 200 Hz and being relatively low but greater than or equal to zero at frequencies greater than approximately 8000 Hz. When configured as a hearing assistance system, an input audio transducer, or microphone, generates the audio input signal from an incident acoustic wave, and an output audio transducer, or speaker, produces an output acoustic wave from the output audio signal.

46 Claims, 6 Drawing Sheets

PHONETIC EQUALIZER SYSTEM

BACKGROUND OF THE INVENTION

The present invention is in the field of audio signal processing and more particularly relates to audio equalizer networks and to hearing assistance systems utilizing such networks.

Audio equalizer networks are used to adjust and/or provide compensation for the frequency response of audio systems. For example, such networks may be used to adjust the frequency response of a loudspeaker system so that the system might have a desired response over specific frequency ranges of interest. Such networks might also be used in a hearing aid system to provide signal level adjustments in specific frequency ranges to compensate for abnormal responses in those ranges of hearing impaired individuals.

Common equalizers consist of a bank of tuned bandpass filters designed for either one octave or $\frac{1}{3}$ octave channel spacing. Typical output adjustment ranges are $\pm 12$ dB for each bandpass channel. First order tuned bandpass filters are often used to avoid the ringing and distortion that result from sharply tuned filters, but such filters are only capable of relatively modest frequency discrimination. Third order $\frac{1}{3}$ octave tuned filters offer much better discrimination, but their ringing is often noticeable to the user. Higher order tuned bandpass filters are generally used only to analyze the frequency content of a signal, not to modify it for audio use.

When the outputs of such multiple bandpass tuned filters are combined, the resulting signal typically is characterized by an appreciable amount of amplitude ripple across the composite band. The ripple increases as the adjustment settings increase from the nominal 0 dB setting. 3 to 4 dB of ripple is common in even the best of the tuned filter equalizers at settings of +10 dB. An impulse applied to a tuned filter set with only 1 dB of ripple will produce ringing that is only 20 dB down from the driving signal. This level of ringing is audible to most listeners, and it contributes to the phenomena of sound masking. As a result, the user hears the equalizer instead of the input. In addition to ringing, tuned equalizers also contribute significant amounts of delay and phase distortion. While such equalizers are effective in some applications, they are generally unsuited for use in assisting hearing impaired individuals, who often show amplitude vs. frequency changes exceeding 60 dB at slopes exceeding 20 dB/octave. Tuned filter equalizers cannot compensate for such characteristics.

Moreover, severely hearing impaired individuals have hearing thresholds which may be 90 dB above "normal", but their threshold of pain may not be significantly different from "normal". This phenomena is called recruitment. In most cases, the individual can not permit the use of a level of amplification sufficient to restore a functional ability to hear because of the constant threat of discomfort. The input levels may be carefully controlled in a clinical setting, but real world input levels cannot be controlled. Even normal speech at a distance of 1 meter has a dynamic range which exceeds 20 dB.

Audio engineers face a problem similar to recruitment in preventing high signals from over-loading their systems. Three approaches are generally used to deal with this problem: hard limiting, soft limiting, and compression. Hard limiting prevents excessive signals by simply restricting the maximum signal to a preset level. The part of a signal that exceeds that level is simply cut off. This approach is simple, but it results in a serious amount of distortion. Soft limiting reduces the gain of the amplifier when a signal exceeds a preset maximum level. The signal is not clipped sharply as in hard limiting. Compression controls the output by automatically turning the gain of the amplifier down as the signal increases above a reference level, and up as the signal decreases below a reference level. Compression results in an output signal with a dynamic range that is reduced by some factor (the compression ratio).

Hard and soft limiting and compression have been used in hearing aids for some time. It is known that the human ear compensates for changes in its input level as a function of amplitude and frequency, but the method is not yet understood. While the need for some type of compression mechanism in hearing aids is evident, the implementations to date have not been shown to be consistently beneficial. Single channel compression is not effective because the compression circuitry responds to the highest signal level regardless of its frequency. Loud low frequencies result in the loss of soft high frequencies, for example. In the absence of a signal, a compression amplifier turns the gain up to maximum, resulting in the overamplification of background noise. In spite of these shortcomings in the prior art, it is considered important that some type of compression be used in hearing aid systems in combination with an equalizer network, although the specific format of such compression is not known in the prior art.

Phase or delay compensation as compared to amplitude compensation has not in the past been shown to be significant in assisting hearing impaired individuals. Standard hearing examinations measure only amplitude sensitivity, as recorded in an audiogram. Extreme phase or delay distortion is certainly apparent to most listeners. Most audio equalizer systems and hearing aids concentrate on amplitude compensation and, other than avoiding severe distortion, do little or nothing about phase compensation. When attention is given to phase, one of two approaches is taken. A filter system which has the minimum possible effect on phase is considered desirable, and a filter system which has linear phase characteristics is considered desirable. Neither of these phase characteristics has been shown to be significant in helping hearing impaired individuals. An equalizer system in which both the amplitude and the phase or delay compensation make a significant contribution in improving the hearing and speech discrimination of hearing impaired individuals is not found in the prior art.

Furthermore, individuals whose audiograms are normal or close to normal are considered to have normal hearing even though they may have significant difficulties in the area of speech discrimination. An equalizer system in which the phase or delay compensation alone can make a significant contribution in improving the speech discrimination of such individuals is not found in the prior art.

With specific regard to the use of equalizers in hearing aid systems, audiologists have used audio equalizers to attempt to compensate for hearing loss for many years. Standard one-octave and $\frac{1}{3}$ octave audio equalizers consisting of parallel banks of first or third order tuned resonant bandpass filters are often used since they are readily available. A system known as the KSAFA, developed by Dorde Kostic, The Kostic' Methodology for Speech and Language Rehabilitation of Hearing Impaired, University of Wisconsin—Superior, Psycholinguistic Series, VII. 1972 almost 25 years ago, is a system which closely resembles a multi-band audio graphic equalizer. The system uses twenty-seven first order active bandpass filter circuits and corresponding attenuators in parallel to selectively modify the frequency characteristic of an audio source. The Q of each filter can be adjusted to modify the "sharpness" of the frequency response of each band. This approach had several disadvantages: (1) with low Q's, the first order filters did not offer sufficient selectivity, (2) with moderate Q's, the filters were more selective but they did not combine smoothly, (3) with high Q's, the filters hardly combined at all, and they tended to ring, (4) the design did not offer sufficient functional dynamic range to compensate for steep loss slopes, and (5) there was considerable phase distortion, and that distortion varied according to the settings.

More recently, digital signal processing techniques have been used to implement audio equalizers digitally. These digital equalizers are usually based on infinite-duration impulse response (IIR) digital filter realizations, which substantially match the characteristics of the standard resonant tuned filters.

The defining equations for the resonant tuned filters are manipulated using the Z transform to yield equivalent equations which can be easily implemented using digital techniques.

Finite-duration impulse response (FIR) digital filter realizations have also been used, although less often since the IIR approach is simpler. FIR implementations offer several advantages, such as smooth frequency band combining, minimum ringing, and "programmability". However, in connection with hearing aids, there are also several disadvantages:

(1) An equalizer preferably includes independent filter banks for each ear, with center frequencies at approximately ¼ octave spacing from 200 Hz to 16,000 Hz, resulting in approximately 48 bandpass filters. In addition, some provision for gain control and compression is desirable. These requirements result in a computationally intensive design with the FIR format.

(2) The frequency characteristics need to be modified in a "graphical" manner so that a therapist can identify results of specific changes. This requirement indicates use of complicated Fast Fourier Transforms (FFT) and inverse FFTs, again leading to a high level of circuit or processing complexity.

(3) Time delays between the time that a therapist's lips move and the time that the patient "hears" the speech can be very confusing, much like a movie that has the sound out of synch with the picture. An additional feedback path for many patients is via bone conduction, bypassing the eardrum. In either case, the computational delays of low powered digital signal processing circuits are simply too long. This delay is not a problem in equalizers which are used for normal recording and playback purposes.

(4) The FIR approach requires many delay stages, extremely high clock speeds, and a corresponding high power consumption. "Wearable" aids using this approach are not yet practical.

(5) The linear phase characteristics of FIR filters are not optimum for compensating for hearing loss.

To partially offset some of the disadvantages of the use of FIR digital filters, analog approximations of FIR digital filters might be used. Such analog approximations are disclosed in G. D. Tattersall, "Linear Phase Among Active Filters With Equiripple Passband Responses", *IEEE Transactions on Circuits and Systems*, Vol. CAS-28, No. 9, Sept. 1981, pp 925-927. The Tattersall article describes a method of realizing a linear phase transversal filter using symmetrical first order all-pass amplifiers and corresponding resistive weights. Each all-pass amplifier is operated only over the limited portion of its frequency response over which its phase characteristics closely approximate those of a pure time delay. This is a marked difference from tuned resonant filters. It is an analog approximation of an FIR filter. When first order all-pass stages are used, there is no frequency aliasing. The Tattersall approach eliminates the computational delays and high power consumption of the digital approach, but it shares the linear phase characteristic of such filters whereby all frequencies are delayed by the same amount. As with its digital counterpart, many delay stages are necessary to achieve good frequency selectivity over the full audio bandwidth. This linear phase limitation makes the Tattersall approach unsuitable for hearing aid applications.

U.S. Pat. No. 4,566,119 (Peters) discloses a variation of the Tattersall approach in the form of analog transversal filters. Those filters use non-symmetrical first order all-pass amplifiers and corresponding resistive weights. They share some of the advantages of FIR filters in that they combine smoothly with minimum ripple and with little ringing. They also display a minimum (rather than linear) phase shift characteristic which is considered desirable in a normal audio equalizer. The equalizers of the '119 patent are capable of modest ($\pm 12$ dB) gain compensation ranges and have relatively broad bandwidths, characteristics which are desirable for normal audio applications. However, those equalizers are not capable of compensating for the steep loss curves and correspondingly large differences in gain vs. frequency typical of serious hearing loss. And while a minimum phase characteristic may be desirable for standard audio applications, it is not optimum for compensating for hearing loss.

Accordingly, it is an object of the present invention to provide an improved audio equalizer network.

Another object is to provide an improved hearing aid system using such an audio equalizer network.

SUMMARY OF THE INVENTION

The present invention is an audio equalizer system. That system is particularly useful in a hearing assistance system for persons with hearing deficits.

In one form, the audio equalizer system includes a filter having a passband extending substantially continuously across the audio spectrum with the filter having an input terminal and an output terminal. The filter is characterized by a selected gain as a function of frequency from its input terminal to its output terminal over the passband. Moreover, the filter is characterized by a phase shift at its output terminal relative to its input terminal which varies continuously with frequency over its passband. The phase shift is other than minimum and is relatively low in total degrees for low frequencies in its passband and relatively high in total degrees for high frequencies in its passband.

The group delay of the filter varies continuously with frequency across said audio spectrum, wherein the group delay is relatively high but less than approximately 10 milliseconds at frequencies less than approximately 200 Hz and is relatively low but greater than or equal to zero at frequencies greater than approximately 8000 Hz.

The system further is adapted to apply an input audio signal to the input terminal of the filter, and generates an output audio signal representative of the signals at the output terminal of said filter. Preferably, the group delay as a function of frequency has an inflection point in the range 1000 Hz to 3000 Hz.

In an analog form of the invention, the filter is a set of n analog transversal bandpass filters, where n is an integer and where the n bandpass filters have substantially non-overlapping passbands extending substantially continuously across said audio spectrum. In a digital form of the invention, the filter is a digital filter, preferably including an FIR filter in series with a phase compensation network (hardware and/or software) to establish the desired gain and phase characteristics.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
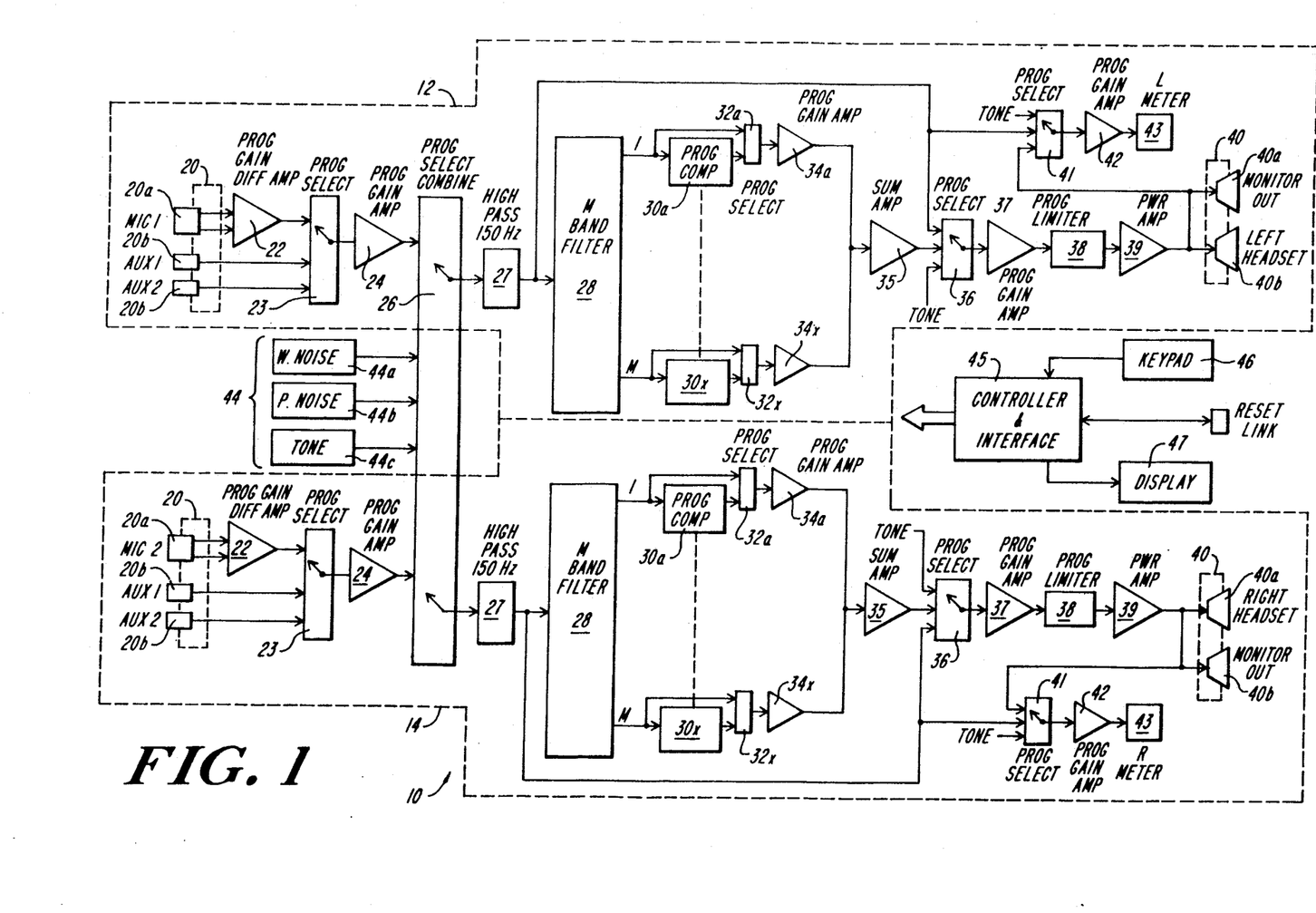
FIG. 1 shows in block diagram form a hearing aid system embodying the present invention.

A hearing aid system 10 embodying the present invention is shown in FIG. 1. The system 10 is a dual channel (left channel 12/right channel 14) audio equalizer specifically designed for use with severely hearing impaired individuals. Each of channels 12 and 14 includes an input panel 20 and associated microphone 20a and accessory inputs 20b, a programmable gain differential preamplifier 22, an input signal selector 23, a programmable gain amplifier 24, a programmable signal selector/combiner 26, a 4-pole highpass filter 27, an M band analog transversal bandpass filter set 28 having 24 bandpass filters 28a through 28x, M programmable compression circuits 30a through 30x, M signal selectors 32a through 32x, M programmable gain amplifiers 34a through 34x, a summing amplifier 35, an output signal selector 36, a programmable amplifier 37, a programmable hard limiter 38, a power amplifier 39, an output panel 40 and associated headset 40b and optional monitor 40a, a meter signal selector 41, a programmable amplifier 42, and a dB meter 43.

The presently described embodiment is adapted for use in analyzing and remediating a patient's hearing problem and accordingly has adjustment and selector controls readily available to an operator. Moreover, this embodiment also has an accessory network 44 which includes a programmable white noise generator 44a and pink noise generator 44b, a programmable tone generator 44c, a system power supply voltage monitor, a 2-line-by-16 character LCD display 47, and a 4×4 keypad 46. A variety of microphones and headphones may be used with the system 10. The overall control of system 10 is established by a microprocessor controller 45. The system 10 may be operated in a stand-alone mode by using the keyboard and display, or in an external control mode by using an external terminal or computer.

Thus, the system 10, as illustrated, is particularly useful in a clinical setting where a therapist may monitor use and make the appropriate adjustments to the programmable and selector elements to evaluate a patient and/or establish an optimum hearing aid configuration. Of course, once the appropriate adjustments are known, a more limited system, and correspondingly compact and less expensive system, may be assembled based on the determined adjustment values. The most critical part of the latter system is the set 28 of analog transversal filters.

The twenty-four analog transversal bandpass filters 28a through 28x of each channel have substantially non-overlapping passbands extending substantially continuously across the audio spectrum. Each filter has a relatively high gain over its passband and a relatively low gain outside its passband. Each filter also provides a phase shift that varies continuously with frequency over its passband where its phase shift is non-linear and is other than minimum. Further, the phase shift in total degrees for each filter is relatively low for low frequencies and relatively high for high frequencies. Further, the group delay for the set of twenty-four filters varies continuously across the audio spectrum, with the group delay being relatively high for low frequencies and relatively low for high frequencies. Preferably, the group delay is less than approximately 10 ms for frequencies less than 200 Hertz and greater than or equal to zero for frequencies greater than approximately 8000 Hertz. Also, it is preferred that the group delay as a function of frequency have an inflection point in the range 1000–3000 Hertz.

Figure 2:
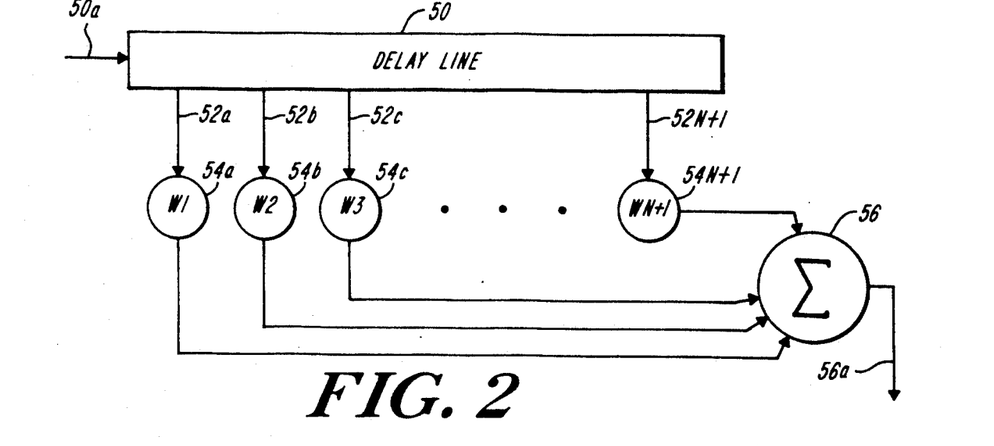
FIG. 2 shows in schematic form an analog transversal filter of the system of FIG. 1.

FIG. 2 shows one of the filters (with center frequency $f_o$) of filter set 28 in block diagram form. The gain and phase characteristics for that filter are shown qualitatively in FIGS. 3A and 3B, respectively.

Figure 3A:
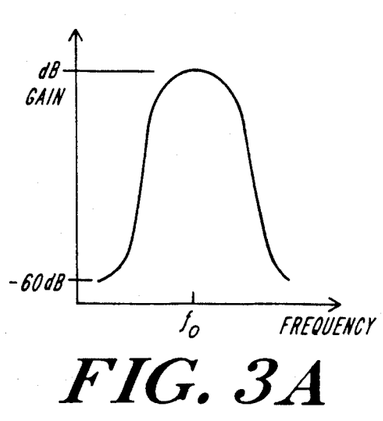
FIG. 3A shows the gain characteristic as a function of frequency of the filter of FIG. 2.
Figure 3B:
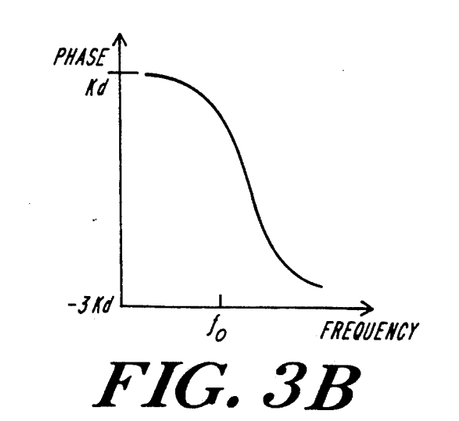
FIG. 3B shows the phase characteristic as a function of frequency of the filter of FIG. 2.

Generally, the filter of FIG. 2 includes an N stage analog delay line 50 having N taps, and N+1 tap lines (52a through 52N+1). Each of the tap lines (except line 52a) provides a delayed version of a signal applied at the input 50a to the delay line. Each of the tap lines is coupled to an associated one of weighting networks 54a through 54N+1, each being characterized by an associated one of gains (or weights) W1 through WN+1. The outputs of the weighting networks are summed in a summing amplifier 56 to establish a filter output signal on line 56a. The weights W1 through WN+1 are selected so that the desired frequency and phase response of FIGS. 3A and 3B are attained for the filter for its associated center frequency.

Figure 4:
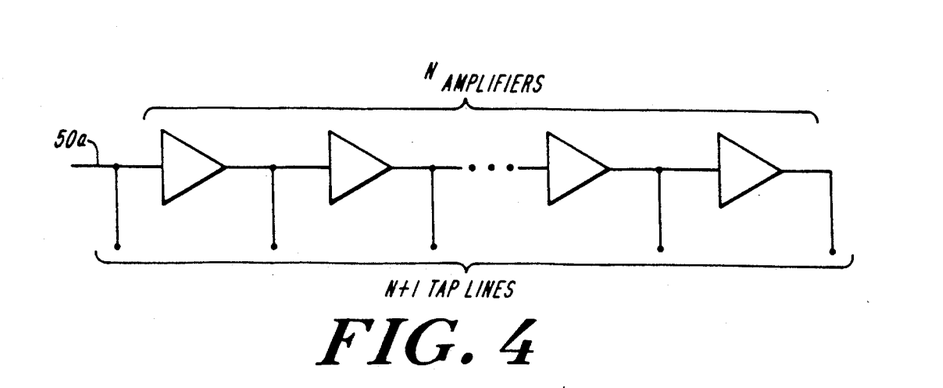
FIG. 4 shows in schematic form an analog delay line for use in the transversal filter of FIG. 2.

In one form of the invention, the delay line 50 is established by a succession of N amplifiers as shown in FIG. 4. In the preferred form, the amplifiers are symmetrical first order all-pass amplifiers, with the weighted summing being established by resistive elements coupled from the tap lines to a summing amplifier.

In contrast to the filters disclosed by the above-referenced Tattersall paper, the filters of the invention do not have a linear or even approximately linear phase response over their passband, even though the filters of set 28 and those of Tattersall all use symmetrical first order all pass amplifiers and corresponding resistive weights. Also, in contrast to the filters disclosed by the above-referenced '119 patent which use non-symmetrical first order amplifiers, and are characterized by minimum phase, the filters of the invention use symmetrical first order amplifiers, and are characterized by other than minimum phase.

Figure 5:
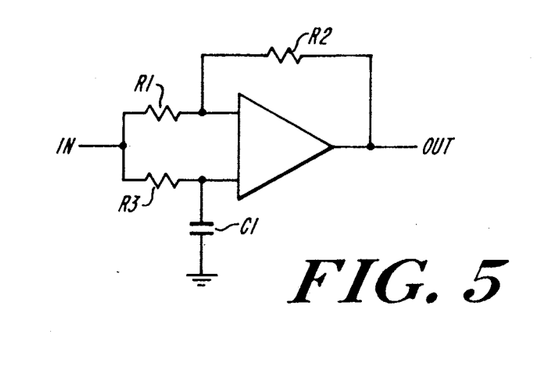
FIG. 5 shows in schematic form a first order all-pass filter for use in the analog delay line of FIG. 4.

Turning now to the circuit details of the preferred embodiment, it should be noted that there are a number of useful designs for the analog delay line 50, including passive RCL, and various active configurations. In the preferred form each delay stage is implemented using a single operational amplifier configured as an all-pass delay network, as shown in FIG. 5.

In an all-pass delay configuration, the gain of the circuit is substantially equal to unity. The phase response is given by $\phi = 2\arctan(2\pi fRC)$ for frequency f and time constant RC. For time constants such as those specified in the Tattersall paper, the resulting phase for this circuit would be approximately linear over the frequency band of interest, i.e. the circuit characteristics approximate those of a pure time delay. In contrast, however, the time constants used in the invention result in a phase response which is distinctly non-linear, i.e. the circuit characteristics do not approximate those of a pure time delay. In other forms of the invention, different types of active elements, such as FET arrays, may be used to realize the same or substantially similar characteristics.

Figure 6:
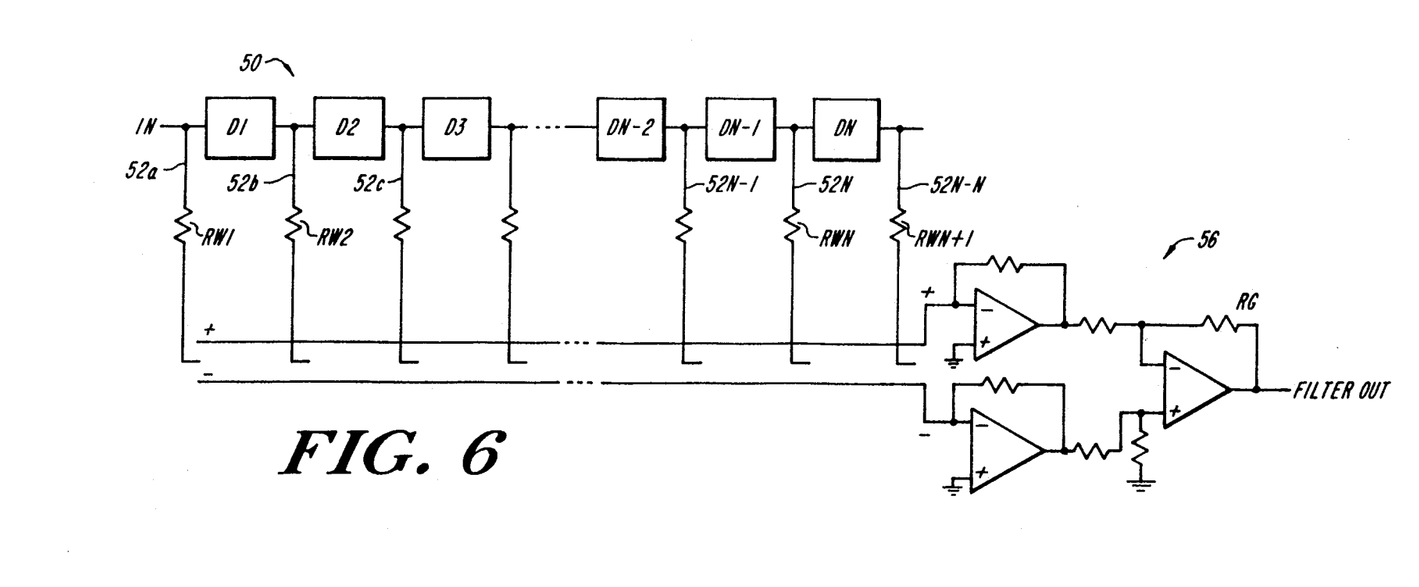
FIG. 6 shows in schematic form the analog transversal filter of FIG. 2.

The analog transversal filter implementation for the preferred embodiment is shown in FIG. 6. The analog delay line 50 consists of N stages, where N=48. A tap at each stage feeds current through one of weight resistors RW1 through RWN+1 into the positive or negative summing line (denoted +and − respectively in FIG. 6) of a current summing differential amplifier (CSDA) 56. The resistor value and sign of the connected summing line determine the contribution of each tap to the whole. Referring to FIG. 6, the effective voltage gain of the $n^{th}$ tap is given by $Vgn = Rg/RWn$, where $n = 1, \ldots, N+1$. For the desired weight for a stage, and with a predetermined value Rg, then the weight resistor RWn is readily determined. Window functions are used to improve the sideband ripple. Since the all-pass delays are not pure time delays, a correction is made for the phase shift. In the preferred embodiment, the first order all-pass filter of FIG. 5 is used for each stage of delay line 50, where R1=R2 and R3=100 Kohm and C1=1000 pf (so that R3 * C1=100 usec).

Figure 7:
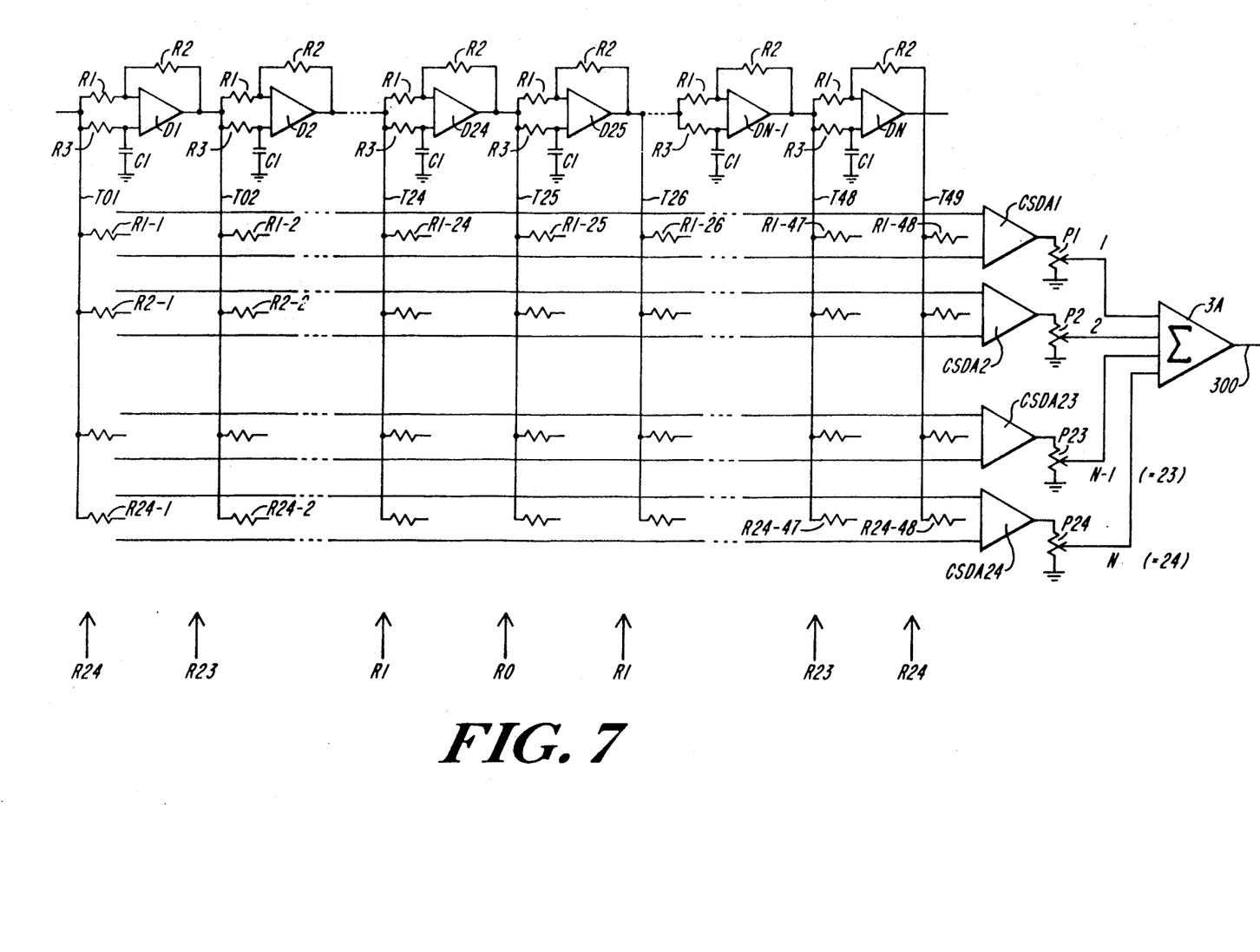
FIG. 7 shows in schematic form the set of analog transversal filters of the system of FIG. 2.

FIG. 7 shows an embodiment of the present invention that utilizes a single N stage tapped delay line 50 and an (N+1)×M resistor array weighting network that couples each of the N+1 tap lines T1-T49 to either the- +or−(as specified below) input summing line of the current summing differential amplifiers (CSDA1-CSDA24) of the respective M channels. The outputs of the CSDA's are weighted via respective ones of potentiometers P1-P24 and are then summed in a current summing amplifier SA to generate a composite output signal on line 300.

Figure 8:
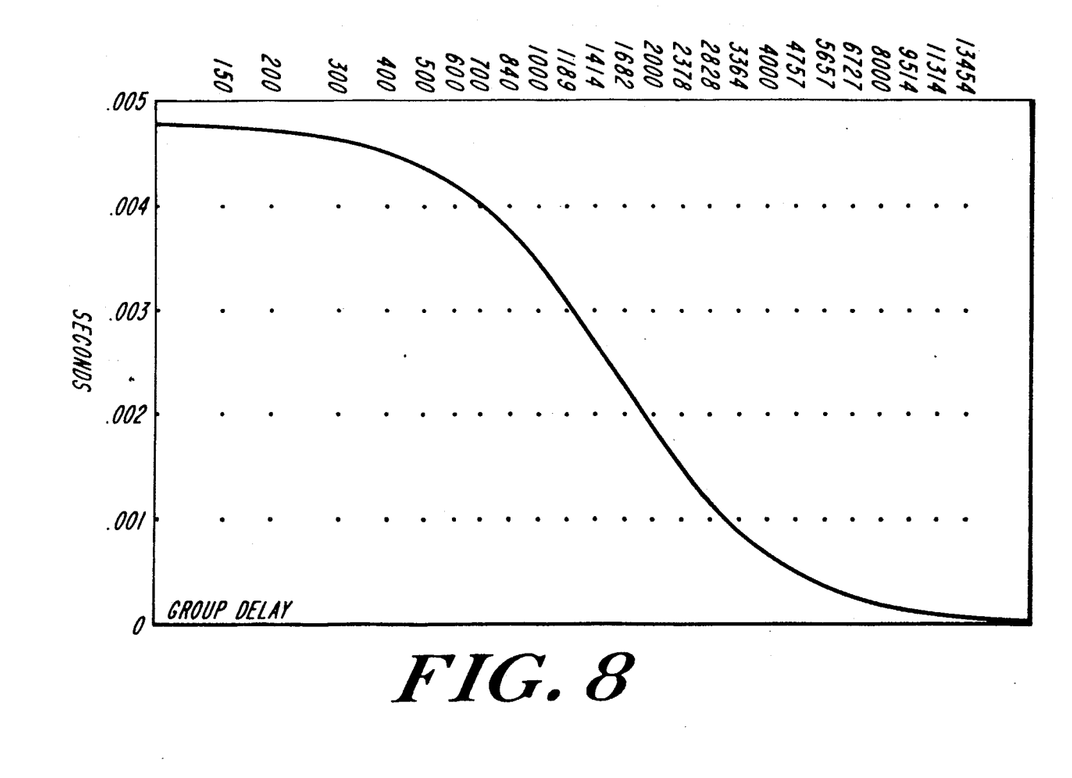
FIG. 8 shows the group delay characteristic of the analog transversal filters of the system of FIG. 1.

The basic delay line stages are first order all-pass filters of the type shown in FIG. 6, again with R1=R2 and R3=100 Kohm and C1=1000 pf (so that R3 * C1=100 usec), although other values may be used in alternative embodiments. In the preferred form, N=48 and M=24. Because of the symmetrical delay stages and corresponding symmetrical weights, the outputs of the respective bandpass filters of FIG. 7 and their composite sum have a phase response given by $\phi = 2M \arctan(2\pi fRC)$ where M=24. The composite group delay characteristic of the respective bandpass filters and their composite sum is shown in FIG. 8. The phase and group delay characteristic of the composite sum of the respective bandpass filters is independent of the relative amplitude of each of the individual bandpass filters. The filters are spaced at intervals which approximate the "critical bands" of the human ear. Ref: Handbook for Sound Engineers, SAMS & Co.; Indianapolis, Ind.; 1987. From 840 Hz to 16,000 Hz, the center frequencies are at ⅓ octave intervals based on a reference frequency of 1000 Hz. The design center frequencies and band edges are derived as specified in ANSI Standard S1.11-1986, Specification for Octave-Band and Fractional-Octave Band Analog and Digital Filters. The actual bandwidths achieved using this design only approximate the design bandwidths. The approximation improves as a function of the number of delay stages and the time delay characteristics of each stage. From 200 Hz to 700 Hz, the center frequencies are at 100 Hz intervals. A different reference frequency and band spacing and bandwidth could be used. Preferable choices are standard ⅓ Octave or ½ Octave spacing. The nominal center frequencies used in the present embodiment are: 200, 300, 400, 500, 600, 700, 840, 1000, 1189, 1414, 1682, 2000, 2378, 2828, 3364, 4000, 4757, 5657, 6727, 8000, 9514, 11,314, 13,454, and 16,000 Hertz.

In FIG. 7, the resistor array weighting network includes forty-nine resistors (=N+1) for each of the 24 (=M) channels. In the preferred embodiments, the resistor values for each channel are in symmetrical pairs, with the center resistor (R1-25, R2-25, . . . , R24-25) being referred to as R0. The remaining resistors are identified as Rn, where n is the "distance" from the center resistor R0. Thus, the resistors on either side of R0 (R1-24 and R1-26, R2-24 and R2-26, . . . , R24-24 and R24-26) have equal values and are referred to as R1. Similarly, the outermost resistors (R1-1 and R1-48, R2-1 and R2-48, . . . , R24-1 and R24-48) have equal values and are referred to as R24. The resistor values for resistor Rn (where n=24, 23, . . . , 1, 0, 1, . . . , 23, 24) for the respective filters are determined from:

$$Cn = (1/n\pi)[\sin(n\phi_1) - \sin(n\phi_2)]$$

where $\phi_1$ is the phase at the high band edge frequency, and $\phi_2$ is the phase at the low band edge frequency, and $$\phi = 2 \arctan(2\pi fRC)$$

where
RC = R3*C1
An = Cn Wn where Wn is a window function
Rn = Rg/An where Rg is a resistor selected to set the channel gain and Rn is the weight setting resistor for tap ±n.

The Blackman window function is used in this embodiment. The Blackman window is given by: $w(n)=0.42+0.5 \cos[2\pi n/(N-1)]+0.08 \cos[4\pi n/(n-1)]$. The forty-nine weight resistors for each filter, time constant, bandpass specification (low frequency cutoff, FL, center frequency, FC, and high frequency cutoff, FH), and gain setting resistor are shown in Tables 1 through 24 in which the column headings are:

C(n)—calculated weight
W(n)—window function value
A(n)—resulting weight
R(n)—calculated weight resistor
RSTD closest standard resistor value and tolerance for the weight resistor Weights for n=25 and n=26 are not used in the preferred embodiment. In Tables 1-24, the + or − sign in the RSTD column indicates the summing line to which the resistors are coupled to for the respective channels.

Figure 9:
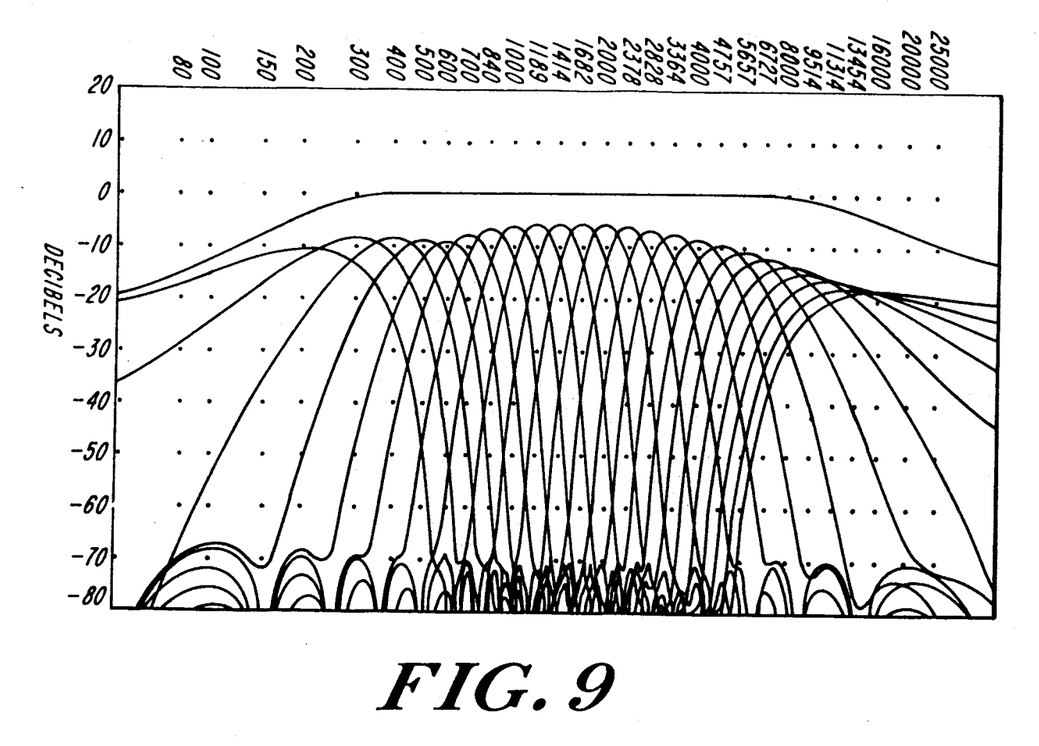
FIG. 9 shows the frequency response of the respective bandpass analog transversal filters, and of the composite of the bandpass analog transversal filters, of an exemplary system embodying the invention.

FIG. 9 shows a plot of the theoretical filter responses for all twenty-four bands for the system using the resistor values from Tables 1-24; in practice with the values set forth above, the skirts which occur at −70 db in FIG. 9 occur at approximately −40 db.

The preferred form of the filter set 26 is a set of analog transversal filters as described above. However, a fully equivalent network may be provided using a single filter implementation of the form shown in FIG. 6. In the latter form, the same composite frequency and phase characteristics are realized directly by one set of N+1 tap weight resistors. The value of each tap resistor is selected to provide the same contribution to the composite output as the M resistors connected to the corresponding tap of the M channel filter set (FIG. 7), scaled by the corresponding M output voltage dividers (P1, . . . P24). This configuration accordingly can provide substantially the same overall characteristics as the multiple filter configuration, but with the direct access to each bandpass filter. In other configurations, the resistors may be adjustable, or part of switched resistor networks, so that the filter characteristics of a single filter network may be adjusted for a desired frequency response.

Another fully equivalent network may be provided using a digital filter implementation using conventional digital design techniques. In this form, using an FIR implementation, the same composite frequency characteristic can be obtained, with a linear phase characteristic, and hardware and/or software phase compensation may be used to tailor that phase characteristic to the desired phase characteristic described above.

In operation of system 10, a therapist may initially fit a hearing impaired patient with earphones 40 of each of channels 12 and 14. The therapist may then apply signals to the microphones 20a of each channel and using input selector 23, preamplifier 22, buffer amplifier 24 and routing selector 26, generate input signals to the filter set 28. The outputs from filter set 28 (on lines 28-1 to 28-M) may be selectively applied to M band audio amplifier 34 and compression network 30. The compressor network 30 provides a band-by-band selectable (or by-passable) compression ratio. Over amplification of background noise is limited by a downward expander which reduces in-band amplification when the signal is below a predetermined threshold. The M channels are combined in summing amplifier 35 routed through output selector 36, amplified by output amp 37, limited by programmable limiter 38, and further amplified by power amp 39.

In various forms of the invention, the limiter 38 may be adapted to perform hard limiting or soft limiting. By monitoring the meter 43 and display 47, and by observing responses from the patient, the therapist may adaptively adjust the gains of the respective bands of filter 28, as well as the compression and/or limiting, to optimize the hearing response of the patient. Also, the delay stages may be used alone, i.e., without the weighting resistors, to allow selection of delay times without modifying the frequency characteristics of the input signal, to correct for/identify certain types of speech abnormalities caused by phase/delay distortion in the ear.

Particularly, due to the filter set 28, the delay in the various band components is a function of frequency that approximates the natural dispersive delay of the normal cochlea, that is, the high frequencies are delayed the least and the low frequencies are delayed the most. Accordingly, the system 10 can be adjusted to compensate for dysfunction of the patient's hearing due to degradation of the delay characteristics of the cochlea. Moreover, by selectively enabling and disabling various frequency bands with the present invention, with their associated delays, the particular abnormal dispersive delays in a patient can be identified.

The invention may further be configured as a hearing assistance system for compensating for delay abnormalities in ears which have substantially normal amplitude sensitivity. In such forms, the signals can be picked off from the delay line at appropriate stages, where no weight resistors or summing networks or required, and symmetry of the delay line is not required.

Once the optimum parameters are determined, a corresponding fixed parameter multiple bandpass filter hearing aid using those parameters may be made for and fitted to the patient. Alternatively, a single composite filter implementation may be made and fitted to the patient. The invention as exemplified by system 10, as well as hearing aids derived from or similar to that system, are generally characterized by good frequency selectivity using a minimum of (symmetrical) delay stages, phase characteristics which simulate the cochlea's natural dispersive characteristics, channels which combine smoothly with little or no band edge ripple, little ringing, no frequency aliasing, minimum computation delay time, a clock rate of zero, and very low power consumption.

While the preferred embodiment has been described above in terms of an analog network, with a set of analog transversal filters, the invention may alternatively be configured in digital form, in which digital filtering techniques are used. For example, the set of filters may be replaced with a (digital) FIR network in series with a hardware and/or software phase compensation network to obtain substantially the same group delay characteristic.

The invention may be embodied in other specific forms with out departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An audio equalizer system comprising:

A. n bandpass filters, where n is an integer, said n bandpass filters having substantially non-overlapping passbands extending substantially continuously across the audio spectrum, each of said n bandpass filters having an input terminal and an output terminal and being characterized by:
  i. a relatively high gain from its input terminal to its output terminal over its passband and a relatively low gain outside its passband, and
  ii. a phase shift at its output terminal relative to its input terminal which varies continuously with frequency over its passband, said phase shift being other than minimum and being relatively low in total degrees for low frequencies in its passband and relatively high in total degrees for high frequencies in its passband,
  whereby the group delay of said n bandpass filters varies continuously with frequency across said audio spectrum, said group delay being relatively high but less than approximately 10 milliseconds for frequencies less than approximately 200 Hz and being relatively low but greater than or equal to zero for frequencies greater than approximately 8000 Hz,
B. means of applying an input audio signal to said input terminals of said n bandpass filters, and
C. output means for generating an output audio signal representative of a sum of the signals at the output terminals of said n bandpass filters, wherein said group delay as a function of frequency has an inflection point in the range 1000 to 3000 Hz.

2. A system according to claim 1 wherein said bandpass filters are digital filters.

3. A system according to claim 1 wherein n=1.

4. A system according to claim 1 wherein said output means includes means for generating an output audio signal representative of a weighted sum of the signals at the output terminals of said n bandpass filters.

5. A system according to claim 4 wherein each of said bandpass filters includes:
  an N stage analog delay line coupled to said input terminal of said bandpass filter, said delay line including means responsive to an analog signal at said input terminal for providing successively delayed versions of said analog signal at a corresponding succession of N+1 points along said delay line, where N is an integer, means for generating N+1 tap signals, each of said tap signals corresponding to the signal at a corresponding one of said points,
  means for generating at said output terminal of said bandpass filter a signal representative of a weighted sum of said N+1 tap signals, whereby said gain and phase shift characteristics of said bandpass filter are established.

6. A system according to claim 5 wherein n=1.

7. A system according to claim 5 wherein the weights for said weighted sum are adjustable.

8. A system according to claim 5 wherein the weights for said weighted sum are predetermined values.

9. A system according to claim 5 wherein said analog delay line includes N series coupled all-pass amplifiers, and wherein said input terminal of said bandpass filter and the outputs of said amplifiers correspond to the respective ones of said N+1 points.

10. A system according to claim 9 wherein each of said all-Pass amplifiers is a first order all-pass amplifier.

11. A system according to claim 4 wherein each of said bandpass filters includes:
  means for generating N+1 tap signals, each of said tap signals corresponding to a successively delayed version of said analog signal,
  means for generating at said output terminal of said bandpass filter a signal representative of a weighted sum of said N+1 tap signals, whereby said gain and phase shift characteristics of said bandpass filter are established.

12. A system according to claim 11 wherein n=1.

13. A system according to claim 11 wherein the weights for said weighted sum are predetermined values.

14. A system according to claim 11 wherein the weights for said weighted sum are adjustable.

15. A system according to claim 11 wherein said analog delay line includes N series coupled all-pass amplifiers, and wherein said input terminal of said bandpass filter and the outputs of said amplifiers correspond to the respective ones of said N+1 points.

16. A system according to claim 15 wherein each of said all-pass amplifiers is a first order all-pass amplifier.

17. A system according to claim 1 wherein each of said bandpass filters includes:
  an N stage analog delay line coupled to said input terminal of said bandpass filter, said delay line including means responsive to an analog signal at said input terminal for providing successively delayed versions of said analog signal at a corresponding succession of N+1 points along said delay line, where N is an integer,
  means for generating N+1 tap signals, each of said tap signals corresponding to the signal at a corresponding one of said points,
  means for generating at said output terminal of said bandpass filter a signal representative of a weighted sum of said N+1 tap signals, whereby said gain and phase shift characteristics of said bandpass filter are established.

18. A system according to claim 17 wherein n=1.

19. A system according to claim 17 wherein the weights for said weighted sum are predetermined values.

20. A system according to claim 17 wherein the weights for said weighted sum are adjustable.

21. A system according to claim 17 wherein said analog delay line includes N series coupled all-pass amplifiers, and wherein said input terminal of said bandpass filter and the outputs of said amplifiers correspond to the respective ones of said N+1 points.

22. A system according to claim 21 wherein each of said all-pass amplifiers is a first order all-pass amplifier.

23. A system according to claim 1 wherein each of said bandpass filters includes:
  means for generating N+1 tap signals, each of said tap signals corresponding to a successively delayed version of said analog signal,
  means for generating at said output terminal of said bandpass filter a signal representative of a weighted sum of said N+1 tap signals, whereby said gain and phase shift characteristics of said bandpass filter are established.

24. A system according to claim 23 wherein n=1.

25. A system according to claim 23 wherein the weights for said weighted sum are predetermined values.

26. A system according to claim 23 wherein the weights for said weighted sum are adjustable.

27. A system according to claim 23 wherein said analog delay line includes N series coupled all-pass amplifiers, and wherein said input terminal of said bandpass filter and the outputs of said amplifiers correspond to the respective ones of said N+1 points.

28. A system according to claim 27 wherein each of said all-Pass amplifiers is a first order all-pass amplifier.

29. A system according to claim 1 further comprising:
an output audio transducer including means for generating an input audio signal representative of an acoustic wave incident thereon, and associated means for coupling said input audio signal to said input terminals of said bandpass filters, and
an output audio transducer including means responsive to said output audio signal for generating an acoustic wave representative of said output audio signal.

30. A system according to claim 1 wherein n=24.

31. A system according to claim 30 wherein the respective center frequencies of said bandpass filters are approximately 200 Hz, 300 Hz, 400 Hz, 500 Hz, 600 Hz, 700 Hz, 840 Hz, 1000 Hz, 1189 Hz, 1414 Hz, 1682 Hz, 2000 Hz, 2378 Hz, 2828 Hz, 3364 Hz, 4000 Hz, 4757 Hz, 5657 Hz, 6727 Hz, 8000 Hz, 9514 Hz, 11314 Hz, 13454 Hz, and 16000 Hz.

32. A system according to claim 1, further comprising a compression means responsive to signal at said output terminal of at least one of said filters for amplitude scaling said signal whereby said scaled signal is characterized by a dynamic range that is reduced compared to the dynamic range of said signal at said output terminal in accordance with a predetermined compression ratio.

33. A system according to claim 36 wherein said compression ratio for each of said filters is independently adjustable.

34. A system according to claim 1 wherein said bandpass filters are analog transversal-filters.

35. A system according to claim 38 wherein n=1.

36. An audio equalizer system comprising:
A. a filter having a passband extending substantially continuously across the audio spectrum, said filter having an input terminal and an output terminal and being characterized by:
i. a selected gain as a function of frequency from its input terminal to its output terminal over said passband,
ii. a phase shift at its output terminal relative to its input terminal which varies continuously with frequency over its passband, said phase shift being other than minimum and being relatively low in total degrees for low frequencies in its passband and relatively high in total degrees for high frequencies in its passband,
whereby the group delay of said filter varies continuously with frequency across said audio spectrum, said group delay being relatively high but less than approximately 10 milliseconds at frequencies less than approximately 200 Hz and being relatively low but greater than or equal to zero at frequencies greater than approximately 8000 Hz,
B. means for applying an input audio signal to said input terminal of said filter,
C. means for generating an output audio signal representative of the signals at said output terminal of said filter, wherein said group delay as a function of frequency has an inflection point in the range 1000 Hz to 3000 Hz.

37. A system according to claim 36 wherein said filter is a set of n analog transversal bandpass filters, where n is an integer, said n bandpass filters having substantially non-overlapping passbands extending substantially continuously across said audio spectrum.

38. A system according to claim 37 wherein n=1.

39. A system according to claim 37 wherein each of said bandpass filters includes:
means for generating N+1 tap signals, each of said tap signals corresponding to a successively delayed version of said analog signal,
means for generating at said output terminal of said bandpass filter a signal representative of a weighted sum of said N+1 tap signals, whereby said gain and phase shift characteristics of said bandpass filter are established.

40. A system according to claim 45 wherein n=1.

41. A system according to claim 37 wherein the weights for said weighted sum are predetermined values.

42. A system according to claim 37 wherein the weights for said weighted sum are adjustable.

43. A system according to claim 37 wherein said analog delay line includes N series coupled all-pass amplifiers, and wherein said input terminal of said bandpass filter and the outputs of said amplifiers correspond to the respective ones of said N+1 points.

44. A system according to claim 43 wherein each of said all-pass amplifiers is a first order all-pass amplifier.

45. A system according to claim 36 wherein said filter is a digital filter.

46. A system according to claim 36 wherein said filter includes:
an N stage analog delay line coupled to said input terminal of said bandpass filter, said delay line including means responsive to an analog signal at said input terminal for providing successively delayed versions of said analog signal at a corresponding succession of N+1 points along said delay line, where N is an integer,
means for generating a tap signal said tap signal corresponding to the signal at a selected one of said points,
means for generating at said output terminal of said bandpass filter a signal representative of said tap signal, whereby said gain and phase shift characteristics of said bandpass filter are established.

* * * * *